United States Patent [19]

Beale

[11] 4,297,387
[45] Oct. 27, 1981

[54] CUBIC BORON NITRIDE PREPARATION

[75] Inventor: Harry A. Beale, Columbus, Ohio

[73] Assignee: Battelle Development Corporation, Columbus, Ohio

[21] Appl. No.: 156,433

[22] Filed: Jun. 4, 1980

[51] Int. Cl.$^3$ .............................................. C23C 11/00
[52] U.S. Cl. ...................................... 427/38; 204/164; 204/192 N; 427/42; 427/255.2
[58] Field of Search ......................... 427/38, 255.2, 42; 204/164, 192 N

[56] References Cited

U.S. PATENT DOCUMENTS

| | | | |
|---|---|---|---|
| 3,152,006 | 10/1964 | Basche | 427/255.2 |
| 3,419,487 | 12/1968 | Robbins et al. | 427/38 |
| 3,499,799 | 3/1970 | Patterson | 427/255.2 |
| 3,531,678 | 9/1970 | Schiavone | 427/255.2 |
| 3,540,926 | 11/1970 | Rairden | 427/42 |
| 3,692,566 | 9/1972 | Branovich et al. | 427/255.2 |
| 3,791,852 | 2/1974 | Bunshah | 427/42 |
| 3,918,219 | 11/1975 | Wentorf et al. | 51/307 |

*Primary Examiner*—John H. Newsome
*Attorney, Agent, or Firm*—Kenneth R. Warburton

[57] ABSTRACT

A deposit of cubic boron nitride is placed on a substrate by an activated reactive evaporation method. The method includes: supporting and heating a substrate in vacuum; evaporating metal vapors into a zone between the substrate and a metals alloy source, said source consisting essentially of at least 60 percent by weight to balance of boron with from 2 to 12 percent by weight of aluminum and at least 0.2 to 24 percent by weight of at least one of cobalt, nickel, manganese, or other aluminide forming element; introducing ammonia gas into the zone; and generating an electrical field in the zone for ionizing the metal vapors and gas atoms in the zone. In the method the substrate generally is heated to a temperature of at least 300° C. with preferred substrate temperatures between about 500° C. and 1100° C., the ammonia gas pressure preferably is about $1 \times 10^{-4}$ torr to $8 \times 10^{-3}$ torr, and a plasma activation in the zone desirably may be provided by employing a deflection electrode maintained at a positive voltage potential and positioned between the substrate and the source of evaporating metal vapors.

9 Claims, No Drawings

4,297,387

CUBIC BORON NITRIDE PREPARATION

TECHNICAL FIELD

This invention relates to cubic boron nitride and its preparation. More particularly the invention concerns activated reactive evaporation deposition being employed to produce coatings comprising cubic boron nitride on substrates for providing cutting tools and the like useful products.

BACKGROUND

Present day commercially available boron nitride material that has the cubic structure at room temperature has been prepared generally by using high pressure technology and processing techniques. Because of the complexity and inherent low volume of high pressure processing, the presently produced cutting tools are expensive.

Cutting tools of cubic boron nitride (CBN) particularly are attractive. Higher cutting rates, compared to tungsten carbide, are possible. In addition, because a coolant can be used with CBN cutting tools, better surface finishes usually can be obtained than when using the $Al_2O_3$-TiC-TiN-$TiO_2$ type cutting tools dry.

Because of its high hardness, abrasion resistance, high thermal and mechanical shock resistance, and relatively neutral behavior, CBN would enjoy much wider usage if it could be prepared more economically and the geometry of the part(s) was (were) not so restricted.

It is known that hexagonal boron nitride (BN) can be converted into a cubic form through treatment at temperatures near 1800° C. and 85 kilobars with this conversion catalyzed by various materials, such as alkali and alkaline earth metals. A synthesis of CBN from BN using certain aluminum alloys as catalysts is taught in U.S. Pat. No. 3,918,219, R. H. Wentorf, Jr. et al., with this synthesis invovling a high pressure, high temperature technique.

U.S. Pat. No. 3,791,852, Rointan F. Bunshah, issued Feb. 12, 1974, and titled "High Rate Deposition of Carbides by Activated Reactive Evaporation" describes a process and apparatus for the production of carbide films by physical vapor deposition in what can be termed to be an activated reactive evaporation deposition technique. This patent, including its drawing figure of a useful apparatus and description thereof, is incorporated in this disclosure by this reference to it.

SUMMARY OF THE INVENTION

In accordance with the present invention a metal alloy source, comprised principally of boron but containing certain other alloying elements including aluminum, is evaporated as metal vapors in the presence of ammonia gas, $NH_3$, at reduced pressure with the metal vapors and gas atoms being subjected to and ionized by a low voltage electrical field whereby a deposit comprised of cubic boron nitride is placed on the surface of a heated substrate.

The invention is based on several fundamentals. First, it is possible to select an alloying addition that serves as a cubic phase nucleator and also as a barrier to possible dislocation motion or transformation nuclei formation. Second, it is possible to utilize a process that allows deposition of the material at relatively low temperatures to reduce or eliminate atom motion and thus help avoid the natural reversion to the hexagonal form. In this manner, what are usually called growth stresses are frozen into the coating. This effectively, although not exactly, simulates the high pressure environment of the other technique.

For the first, there is employed a cubic compound that is markedly stable and a small amount of a cubic metal in an attempt to provide some mechanical shock resistance. For the second there is employed reactive evaporation. In this process, the hottest area is the molten evaporant source. The substrate temperature easily can be maintained at a considerably lower temperature than the source. Further, evaporated atoms have the lowest kinetic energy as they approach the substrate of any coating process.

The invention opens a new realm of material mixture development with preselectable phase structure. Scientific principles involved in the present process are: (1) the proper selection and addition during coating deposition of barriers to transformation nuclei formation or dislocation motion, and (2) deposition at relatively low temperatures to reduce atom motion.

In reactive evaporation, metal vapor atoms from an evaporative source react with reactive gas atoms in the vapor phase to form compounds. In activated reactive evaporation, the reaction is stimulated by ionizing one or both of the metal vapor atoms and the gas atoms with this ionization generally provided by an electrical field. The activated reactive evaporation for formation of cubic boron nitride (CBN) can be illustrated.

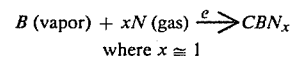

$$B\ (vapor) + xN\ (gas) \xrightarrow{e} CBN_x$$
where $x \cong 1$

DETAILED DESCRIPTION AND BEST MODE

The invention provides for deposition of cubic boron nitride on a substrate through activated reactive evaporation by a method which includes: (a) supporting a substrate in a vacuum and heating the substrate; (b) evaporating metal vapors into a zone between the substrate and the metals alloy source from a metals alloy source consisting essentially of at least 60 percent by weight to balance of boron with from 2 to 12 percent by weight of aluminum and at least 0.2 to 24 percent by weight of at least one of cobalt, nickel, manganese, or other aluminide forming element; (c) introducing ammonia gas into said zone; and (d) generating an electrical field in the zone for ionizing the metal vapors and gas atoms in the zone; whereby a deposit of cubic boron nitride is placed on the surface of the substrate.

To practice the invention's method one utilizes a vacuum chamber apparatus, such as illustrated in the aforementioned U.S. Pat. No. 3,791,852. Such an apparatus includes a vacuum chamber which may comprise a conventional cover or dome resting on a base with a sealing gasket at the lower rim of the cover. A support and feed unit for a source metal rod may be mounted in the base. The unit includes a mechanism for moving the metal rod upward at a conrtrolled rate. Cooling coils may be mounted in the unit and supplied with cooling water from a cooling water source. An electron gun is mounted in the unit and provides an electron beam along the path to the upper surface of the metal rod, with the electron gun being energized from a power supply.

A substrate on which the CBN is to be deposited, is supported in a frame on a rod projecting upward from the base. The substrate is heated by an electric resistance heater supported on a bracket. Energy for the heater is provided from a power supply via a cable. The temperature of the substrate is maintained at a desired value by means of a thermocouple in contact with the upper surface of the substrate, with the thermocouple connected to a controller by a line, with the controller output signal regulating the power from the supply to the heater.

The desired low pressure is maintained within the vacuum chamber by a vacuum pump connected to the interior of the chamber via a line. Ammonia gas from a supply is introduced into the zone between the metal rod and substrate via a line and nozzle. A shutter is mounted on a rod which is manually rotatable to move the shutter into and out of position between the metal rod and substrate.

A deflection electrode, typically a tungsten rod, is supported from the base in the reaction zone between the metal rod and substrate. An electric potential is provided for the rod from a voltage supply via a line. An electric insulating sleeve, typically of glass, is provided for the rod within the vacuum chamber, with the metal surface of the rod exposed only in the zone between the source and substrate. When a potential is connected to this electrode, some of the electrons from a region just above and/or adjacent to the molten pool, created at the end of the rod, are attracted to the reaction zone. The pool is the preferred source of electrons for the electrode, but a separate electron gun could be added if desired.

Various components utilized in the apparatus described above may be conventional. The evaporation chamber may be a 24 inch diameter and 36 inch high water cooled stainless steel bell jar. The vacuum pump may be a 10 inch diameter fractionating diffusion pump, with an anti-migration type liquid nitrogen trap. The source metal unit may be a 1 inch diameter rod fed electron beam gun, self-accelerated 270° deflection type, such as Airco Temescal Model R1H-270. The power supply may be an Airco Temescal Model CV20 20 kw unit which may be operated at a constant voltage such as 10 kilovolts, with a variable emission current.

Various sizes and shapes of substrates can be utilized. A typical substrate is a 3 inch by 10 inch metal sheet in the order of 5 mils thick. Various metals have been used including stainless steel, titanium and zirconium. Other substrate materials can be used including tool steels and carbides, such as WC/C alloy and SiC. In one embodiment the substrate is based about eight inches above the surface of the metal source. The heater may be a 18 kilowatt tantalum resistance heater providing for heating the substrate to 700° C. and higher temperatures, as desired.

The metals source material may be a solid rod or billet and for the just-described feed unit may approximate about 1 inch diameter and 6 inches in length. The solid rod for the metals alloy source may be provided by a preparation method in which particulate metals mixed together in the amount providing the desired requisite composition are melted and molten drops therefrom dripped or flowed into a water-cooled cylindrical mold of appropriate material and size. The useful metals alloy source consists essentially of at least 60 percent by weight to remaining balance of boron and from 2 to 12 percent by weight of aluminum with at least 0.2 to 24 percent by weight of at least one of cobalt, nickel, manganese, or other aluminide-forming element. Contemplated as useful other aluminide-forming elements are those which form with aluminum an intermetallic compound of high melting point and a cubic structure, and include zirconium, iron and the like. Preferably the metals alloy source consists essentially of boron, aluminum, cobalt and nickel within the aforestated amounts. Within these aforestated amounts preferably the ratio of cobalt and/or nickel to aluminum is slightly greater than 2 to 1 by weight. An especially preferred metals alloy source consists essentially of 10 percent by weight of aluminum, 10 percent by weight of cobalt, 10 percent by weight of nickel, and balance (i.e. 70 percent by weight) of boron.

The microstructure of the deposited boron nitride on the substrate, as already mentioned, or the placing CBN onto the surface of the substrate, depends on having at least a small amount of cubic compound, i.e. cubic metal, present to provide barriers to transformation of boron nuclei formation of dislocation and thus to favor and induce the placing of CBN instead of merely BN. Additionally the placing of CBN depends greatly upon the temperature of the substrate onto which it deposits. Of course for deposit on the substrate temperature, the substrate typically is at a temperature lower than the metals alloy source providing the metal vapors. Low substrate temperatures favor formation of powdery and less adherent deposits and lesser formation and/or deposit of CBN. For providing deposits of which the boron nitride content is appreciable, the substrate for practice of the invention is at an elevated temperature and generally heated to a temperature of at least 300° C. Preferred temperatures of the substrate are from about 500° C. to 1100° C. Especially preferred are maintained substrate temperatures of about 900° C. to 1100° C. for at these temperatures and with the preferred and especially preferred compositions of the metals alloy source the deposit can be provided with a greater than 75 percent by weight CBN content.

The present invention employs ammonia gas as the source of nitrogen in formation of the CBN placed on the substrate. This ammonia is admitted or introduced generally through needle valves at a rate adequately correlated with the rate at which the metal vapors are provided so that preferably at least the stoichiometric amount of nitrogen atoms from the gaseous ammonia molecule are present in the zone whereat activation or ionization of the gas atoms is provided. Of course the partial pressure of the introduced ammonia gas needs be such that ionization can be provided, such as by the usual electrical field. A preferred range for gas pressure is about $1 \times 10^{-4}$ torr to $8 \times 10^{-3}$ torr.

Plasma activation is highly favored to effect the completion of the chemical reaction providing CBN. To accomplish this employing the aforedescribed vacuum chamber apparatus, the deflection electrode, which is positioned between the molten metals alloy source and the substrate, is electrically biased to a potential of about +20 volts typically. The electrons, which are gathered from the region adjacent the surface of the molten pool of the metals alloy source, typically have low energies, 0.1 to 10 electron volts and large scattering cross-sections. Upon collision with neutral $NH_3$ gas molecules and/or B atoms, ions are created. Either the ionization phenomena or the presence of ultraviolet radiation typical of plasma induces the chemical reaction which otherwise might not occur. It should be noted that other plasma-type processes also are contemplated as useful for the production of CBN, for example reactive sputtering, reactive ion plating, hot hollow cathode reactive evaporation, and plasma enhanced thermal evaporation.

EXAMPLE

By way of example of the invention CBN was deposited on the surface of a rectangular stainless steel sheet about 3 inches by 10 inches. The vacuum chamber was initially pumped down to $10^{-6}$ torr pressure and was then purged with nitrogen gas to $10^{-4}$ torr for a few minutes. The chamber was again pumped down to $10^{-6}$ torr. This procedure was used to minimize the presence of extraneous gases.

When the pressure in the chamber was again down to $10^{-6}$ torr, the electron gun was turned on and a molten pool of metal was formed by the electron beam at the upper end of the rod. The employed rod was of a composition consisting essentially of 70 percent by weight boron, 10 percent by weight aluminum, 10 percent by weight cobalt, and 10 percent by weight nickel. The shutter was in position blocking the substrate. The reaction gas, ammonia, was then introduced into the vacuum chamber at a controlled rate to obtain a desired chamber pressure of $10^{-4}$ torr. The power supply for the deflection electrode was turned on and the potential increased until the reaction began, as indicated by a substantial increase in current in the electrode. Concurrently therewith the resistance heater was operated to bring the stainless steel sheet substrate to 1000° C. When steady state conditions were obtained the shutter was moved to one side and CBN was deposited on the substrate. The process was continued until a desired thickness was obtained, after which the shutter was moved to the blocking position and the various supplies were turned off. After between 15 and 30 minutes operating, the stainless steel sheet had one side coated with a deposit about ½ mil thick (~13 microns) predominantly of cubic boron nitride and in the order of 75 percent by weight or higher of cubic boron nitride, with the balance chiefly $Fe_2B$ and with little to no hexagonal BN being detectable. The $Fe_2B$ apparently occurs because the employed substrate was of stainless steel. The compositional analysis was based upon an X-ray study utilizing the Debye-Scherrer method using pulversized fragments of the deposit. In the photodensitometer scan made from the Debye-Scherrer film, no peaks are observable for the alloying constituents because they are present in such small quantities and are uniformly distributed throughout the aggregate. The alloying serves to introduce stresses; this is indicated by slight angular shifting of the X-ray diffraction peaks from their non-stress positions. Additional shifting has also probably occurred because the deposited material is $BN_x$, where x has slightly less than the desired unity value. Because of the X-ray peak broadening, it can be inferred that the grain size of the produced CBN was considerably less than the pulverized fragments of the deposit used for compositional analysis. Although no cutting or wear tests were made on the deposit, the deposit resisted scratching by a hand-held industrial diamond edged tool. In contrast the reverse side of the substrate, i.e. the uncoated stainless steel side, was scratched readily by the same hand-held industrial diamond edged tool.

Although the invention's method has been described with particularity as applied to a sheet, substrates of other geometrical configurations are contemplated as also readily having the CBN deposited thereon. For example reamers (helical and other geometries), blade cutters, and the like should be readily susceptible to depositing the CBN thereon in that very few restrictions on substrate geometry exist in evaporative coating.

Additionally it is within the realm of the invention to contemplate producing a coating deposit-substrate interdiffusion, e.g. by heat treatment, to improve deposit adherence. Further depositing of various alloying elements along with the CBN is contemplated for various purposes, such as improving deposit ductility. It has been noted that slight amounts of nickel deposited along with the CBN increases deposit ductility.

I claim:

1. A method for deposition of cubic boron nitride on a substrate, which method comprises the steps of:
    (a) supporting a substrate in a vacuum and heating the substrate;
    (b) supplying metal vapors into a zone between the substrate and a metals alloy source, said source consisting essentially of at least 60 percent by weight to a balance of boron with from 2 to 12 percent by weight of aluminum and at least 0.2 to 24 percent by weight of at least one of cobalt, nickel, manganese or other aluminide-forming metal;
    (c) introducing ammonia gas into said zone; and
    (d) generating electrical field in said zone ionizing the metal vapors and gas atoms in the zone;
whereby a deposit comprised of cubic boron nitride is placed on the surface of said substrate.

2. The method of claim 1 including directing an electron beam onto the metals alloy source for providing the metal vapors by evaporation.

3. The method of claim 1 wherein the substrate is heated to between about 500° C. and 1100° C.

4. The method of claim 3 wherein the ammonia is introduced in an amount providing a gas partial pressure between about $1 \times 10^{-4}$ torr to $8 \times 10^{-3}$ torr in said zone.

5. The method of claim 4 involving generating of the electrical field in said zone through imposing a voltage potential positive with respect to said source on a deflection electrode positioned between the substrate and the metals alloy source.

6. A method for deposition of cubic boron nitride on a substrate by reactive evaporation, which method comprises the steps of:
    (a) supporting a substrate in a vacuum and heating the substrate to about 1000° C.;
    (b) evaporating metal vapors into a zone between the substrate and a metals alloy source by impinging an electron beam of about 0.3 amperes and a voltage of about 10 kilovolts onto the metals alloy source, said source consisting essentially of 10 percent by weight aluminum, 10 percent by weight of cobalt, 10 percent by weight of nickel, and balance boron;
    (c) introducing ammonia gas amounting to about $4 \times 10^{-4}$ torr partial pressure into said zone;
    (d) generating a low voltage electrical field in said zone ionizing the metal vapors and gas atoms in the zone and deflecting electrons to said zone;
whereby a deposit comprised predominantly of cubic boron nitride then is deposited on the surface of said substrate.

7. The method of claim 6 employing the substrate which is stainless steel.

8. The method of claim 7 involving generating of the electrical field in said zone through imposing a potential of about +20 volts with respect to said source on a deflection electrode positioned between the substrate and the metals alloy source.

9. The method of claim 1 wherein the supplying of the metal vapors includes any of the following of an electron beam, evaporation reactive sputtering, reactive ion plating, cathode reactive evaporation, or plasma enhanced thermal evaporation.

* * * * *